(12) United States Patent
Egitto et al.

(10) Patent No.: US 7,011,531 B2
(45) Date of Patent: Mar. 14, 2006

(54) MEMBRANE PROBE WITH ANCHORED ELEMENTS

(75) Inventors: Frank D. Egitto, Binghamton, NY (US); Keith J. Miller, Endicott, NY (US); Manh-Quan T. Nguyen, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 11/031,859

(22) Filed: Jan. 7, 2005

(65) Prior Publication Data

US 2005/0121800 A1     Jun. 9, 2005

Related U.S. Application Data

(62) Division of application No. 10/263,510, filed on Oct. 1, 2002, now Pat. No. 6,881,072.

(51) Int. Cl.
*H01R 12/00*     (2006.01)

(52) U.S. Cl. .......................................... 439/67; 29/883

(58) Field of Classification Search .................. 439/67, 439/66, 61; 174/264, 265, 266; 29/883
See application file for complete search history.

(56) References Cited

U.S. PATENT DOCUMENTS

| | | | |
|---|---|---|---|
| 4,064,623 A * | 12/1977 | Moore ........................... | 29/876 |
| 5,539,156 A | 7/1996 | Chobot et al. | |
| 5,575,662 A | 11/1996 | Yamamoto et al. | |
| 5,599,193 A * | 2/1997 | Crotzer ........................... | 439/66 |
| 5,800,650 A * | 9/1998 | Anderson et al. ............ | 156/150 |
| 5,864,946 A | 2/1999 | Eldridge et al. | |
| 5,977,783 A | 11/1999 | Takayama et al. | |
| 6,163,957 A | 12/2000 | Jiang et al. | |
| 6,208,156 B1 | 3/2001 | Hembree | |
| 6,242,103 B1 | 6/2001 | Farnworth et al. | |
| 6,395,993 B1 | 5/2002 | Nakamura et al. | |
| 6,426,636 B1 | 7/2002 | Das et al. | |
| 6,492,007 B1 * | 12/2002 | Iinaga ......................... | 428/209 |
| 2001/0033179 A1 | 10/2001 | DiFrancesco | |

FOREIGN PATENT DOCUMENTS

| | | |
|---|---|---|
| JP | 6283865 | 10/1994 |
| JP | 2001004700 | 1/2001 |

\* cited by examiner

*Primary Examiner*—Phuong Dinh
(74) *Attorney, Agent, or Firm*—Schmeiser, Olsen & Watts; William H. Steinberg

(57) ABSTRACT

A structure and method to establish an electrical connection between a tester and an electrical component. A flexible dielectric layer has a first side and a second side. A through via extends through the first side and the second side of the dielectric layer. A blind via is placed in a position that is offset from the through via and extends laterally in a first direction from a section of the first through via to a section of the flexible dielectric layer. The blind via extends in a second direction from the first side of the flexible dielectric layer to a section of the flexible dielectric layer that is between the first side and the second side of the dielectric layer. An electrically conductive member extends through the through via and extends into the blind via, thereby filling the through via and the blind via. The electrically conductive member has a first surface and a second surface. Any distance between the first surface and the second surface is greater than a distance between the first side of the dielectric layer and the second side of the dielectric layer.

17 Claims, 6 Drawing Sheets

MEMBRANE PROBE WITH ANCHORED ELEMENTS

BACKGROUND OF THE INVENTION

This application is a divisional of Ser. No. 10/263,510; filed on Oct. 1, 2002 U.S. Pat. No. 6,881,072.

1. Technical Field

The present invention relates to a probe used to establish an electrical connection between a test device and an electrical component.

2. Related Art

Probes used for establishing an electrical connection between a test device and an electrical component may consist of electrically conductive rivets within a dielectric material. These rivets are typically placed in a via within the dielectric material. When a force is applied to the rivet from the test device and the electrical component, the rivet may tend to spin within the via causing the rivet to electrically short to an adjacent via, thereby causing the electrical component to fail. Thus there is a need for preventing such failure.

SUMMARY OF THE INVENTION

The present invention provides an electrical interconnection structure, comprising:

a flexible dielectric layer having a first side and a second side;

a first through via extending through the first side and the second side of the dielectric layer;

a first blind via, wherein the first blind via is offset from the first through via and extends laterally in a first direction from a section of the first through via to a section of the flexible dielectric layer, and wherein the first blind via extends in a second direction from the first side of the flexible dielectric layer to a section of the flexible dielectric layer that is between the first side and the second side of the dielectric layer; and a first electrically conductive member extending through the first through via and extending into the first blind via, wherein the first electrically conductive member has a first surface and a second surface, and wherein any distance between the first surface and the second surface is greater than a distance between the first side of the dielectric layer and the second side of the dielectric layer.

The present invention provides an electrical interconnection structure, comprising:

a flexible dielectric layer having a first side and a second side;

a non-circular through via extending through the first side and the second side of the dielectric layer; and an electrically conductive member extending through the through via, wherein the electrically conductive member has a first surface and a second surface, wherein a distance between the first surface and the second surface is greater than a distance between the first side of the dielectric layer and the second side of the dielectric layer.

The present invention provides a method for forming an electrical interconnection structure, comprising:

providing a flexible dielectric layer having a first side and a second side;

coupling a first side of a metallic layer to the second side of the flexible dielectric layer;

creating a first through via extending from the first side and the second side of the dielectric layer;

creating a first blind via offset from the first through via and extending laterally from the first through via in a first direction and extending in a second direction from the first side of the flexible dielectric layer to a section of the flexible dielectric layer that is between the first side and the second side of the dielectric layer;

forming a first bump by electroplating a metallic material on to the first side of the metallic layer and within the first through via, wherein the metallic material is over-plated in a third direction, filling the first through via, the first blind via, and extending in the third direction so that any distance between a first surface of the first bump and the first side of the metallic layer is greater than a distance between the first side and the second side of the dielectric layer, and wherein due to the over-plating the metallic material extends laterally in the first direction and extends laterally in a direction that is opposite to the first direction; and etching a first pad at the end of the metallic layer, wherein the pad is electrically coupled to the bump, and wherein a first electrically conductive member is formed from the first bump, the filled first through via, the filled first blind via, and the etched first pad.

DETAILED DESCRIPTION OF THE INVENTION

Figure 1:
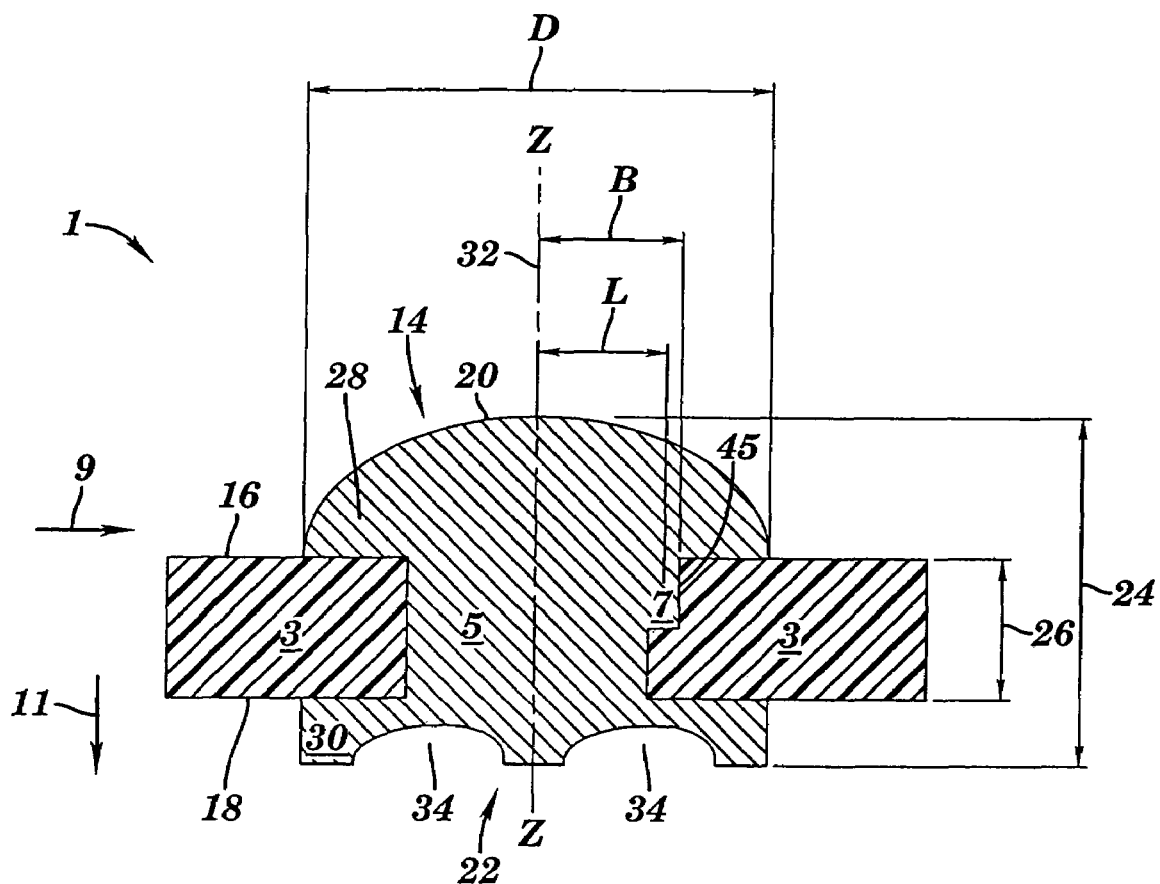
FIG. 1 illustrates a front cross sectional view of an electrical interconnection structure comprising an electrically conductive member and a circular blind via, in accordance with embodiments of the present invention.

FIG. 1 illustrates a front cross sectional view of an electrical interconnection structure 1 comprising an electrically conductive member 14 having a first surface 20 and a second surface 22 extending through a first side 16 and a second side 18 of a flexible dielectric layer 3 to establish an electrical and mechanical connection between devices to be tested and a tester, in accordance with embodiments of the present invention. The electrical interconnection structure 1 may be a thin flexible interposer (TFI) membrane probe used for electrical testing of chips in a wafer format. The flexible dielectric layer 3 may be a polyimide (e.g., KAPTON®, etc). The flexible dielectric layer 3 may have a thickness in a range of about 0.5–2 mils. The flexible dielectric layer 3 comprises a through via 5 and a blind via 7. The via 5 and a blind via 7 may each have vertical sidewalls (i.e., parallel to the direction 11) or angular sidewalls (with respect to the direction 11). The through via 5 extends through the first side 16 and the second side 18 of the dielectric layer. The blind via 7 is offset from the through via 5 and extends laterally in a first direction 9 from a section of the through via 5 to a section of the flexible dielectric layer 3. Additionally the blind via 7 extends in a second direction 11 through the first side 16 of the flexible dielectric layer 3 to a section of the flexible dielectric layer 3 that is between the first side 16 and the second side 18 of the dielectric layer 3. A portion of the electrically conductive member 14 fills the through via 5 and the blind via 7. The center of the blind via 7 should be offset laterally in the first direction 9 from the center of the through via 5 by an offset distance L. A first distance D is defined as a lateral extent of the first surface 20 of the electrically conductive member 14 in the direction 9 (i.e., the first distance (D) is a maximum distance across a planer region defined by an intersection of the first surface 20 of the first electrically conductive member 14 and the first side 16 of the dielectric layer 3). A second distance B is defined as a distance between a furthest edge 45 of the blind via 7 and an axis 32 that is perpendicular to the first side 16 of the dielectric layer 3 and is centrally located in the through via 5. The relationship between the aforementioned distances is as follows: B<D/2. The electrically conductive member 14 may be, inter alia, a rivet, etc. The electrically conductive member 14 may comprise an electrically conductive material (e.g., metal or metallic alloy) such as, inter alia, copper, nickel, aluminum, etc. The electrically conductive member 14 may be formed by a plurality of methods including, inter alia, electro-plating, etc (see FIG. 6A–6D). The through via 5 and the blind via 7 may be formed by a plurality of methods including, inter alia, mechanical or laser drilling (laser ablate). The first surface 20 of electrically conductive member 14 may be curved in shape thereby forming a curved bump 28 (i.e., if the bump 28 has a semi-spherical shape then the distance D would equal the diameter of the semispherical shape). The second surface 22 of the electrically conductive member 14 may comprise a pad 30. The pad 30 may comprise at least one recessed opening 34. A distance 24 between a top of the first surface 20 of electrically conductive member 14 and the second surface 22 of the electrically conductive member 14 is greater than a distance 26 between the first side 16 and the second side 18 of the dielectric layer. The electrically conductive member 14 may be used to establish an electrical connection between a pad 47 on a test apparatus 49 and an electrical component 51 (see FIG. 7). The test apparatus 49 may comprise, inter alia, a space transformer, etc. The electrical component 51 may comprise, inter alia, a semiconductor chip (e.g., flip chip applications), etc. The first surface 20 of the electrically conductive member 14 is electrically coupled to the pad 47 on the test apparatus 49 and the second surface 22 of the electrically conductive member 14 is electrically coupled to the electrical component 51, thereby establishing the electrical connection between a pad 47 on a test apparatus 49 and an electrical component 51. The aforementioned procedure may be used in a variety of applications. The electrical interconnect structure 1 may comprise a plurality of electrically conductive members that are equivalent to the aforementioned electrically conductive member 14 (e.g., see FIG. 6A–6D). The plurality of electrically conductive members are electrically insulated and mechanically separated from each other.

Figure 2:
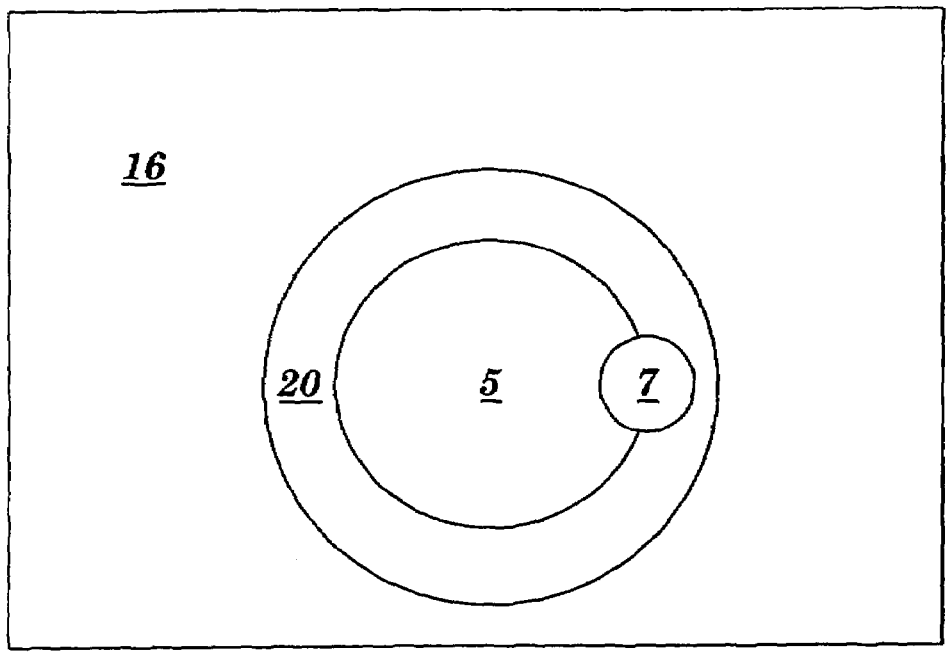
FIG. 2 illustrates a top view of the electrical interconnection structure of FIG. 1, in accordance with embodiments of the present invention.

FIG. 2 illustrates a view of a plane that is perpendicular to the axis 32 in FIG. 1 and parallel to the first side 16 of the flexible dielectric layer 3, showing the through via 5 and the blind via 7, in accordance with embodiments of the present invention. The through via 5 and the blind via 7 in the aforementioned plane both have a circular shape. Alternatively, the through via 5 and the blind via 7 in the aforementioned plane may comprise a plurality of shapes including, inter alia, elliptical, square, rectangular, star shaped, triangular, hexagonal, etc.

Figure 3:
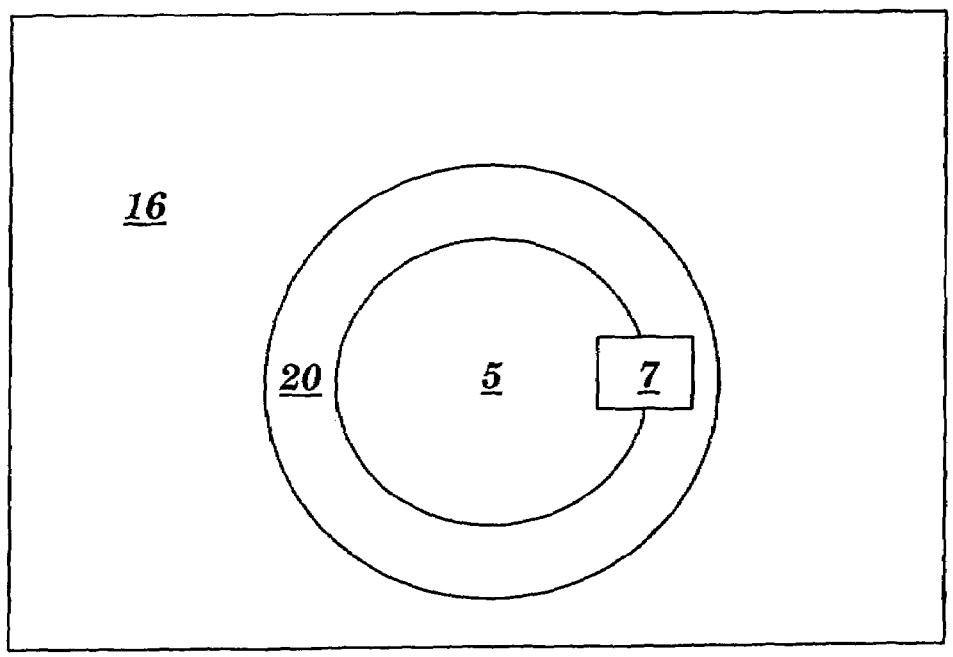
FIG. 3 illustrates FIG. 2 with the circular blind via replaced by a rectangular blind via, in accordance with embodiments of the present invention.

FIG. 3 illustrates an alternative embodiment of FIG. 2 illustrating a view of a plane that is perpendicular to the axis 32 in FIG. 1 showing the through via 5 and the blind via 7, in accordance with embodiments of the present invention. In contrast with FIG. 2, the blind via 7 in FIG. 3 has a rectangular shape. Alternatively, the through via 5 and the blind via 7 in FIG. may comprise a plurality of shapes including, inter alia, circular, elliptical, rectangular, star shaped, triangular, hexagonal, etc.

Figure 4:
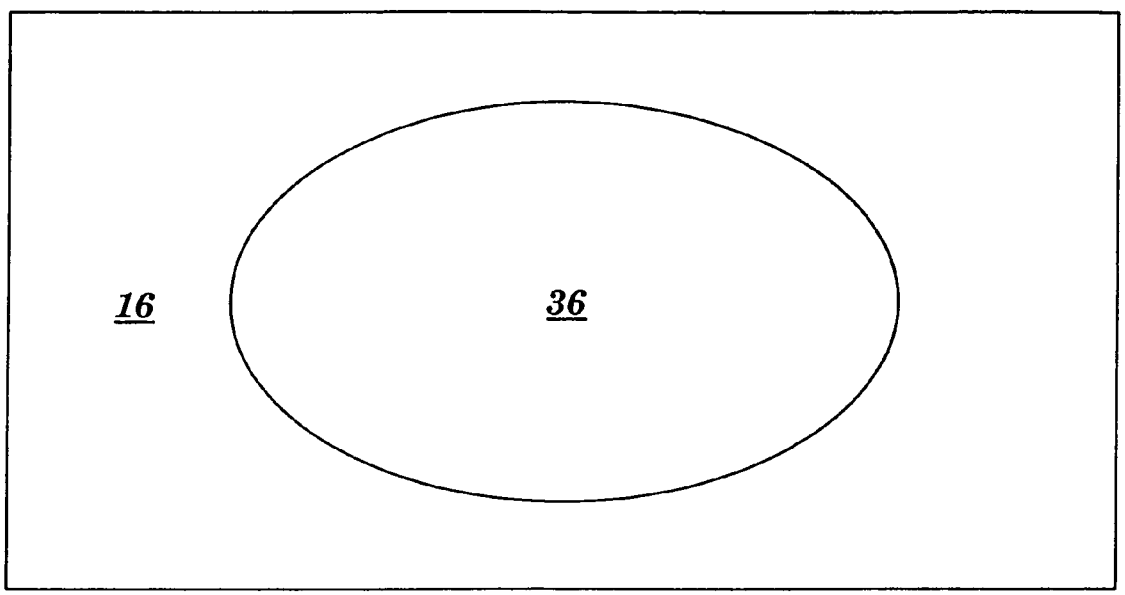
FIG. 4 illustrates FIG. 2 with a non-circular through via and without a blind via, in accordance with embodiments of the present invention.

FIG. 4 illustrates an alternative embodiment showing a view of a plane that is perpendicular to the axis 32 in FIG. 1 such that the through via 36 is non-circular in shape, in accordance with embodiments of the present invention. This embodiment comprises a non-circular through via 36 without a blind via 7 (see FIG. 1). The non-circular through via 36 may comprise a plurality of polygonal shapes including, inter alia, circular, elliptical, square, rectangular, star shaped, triangular, hexagonal, etc. All other characteristics of the electrical interconnection structure 1 in FIG. 4 are the same as in FIG. 1.

Figure 5:
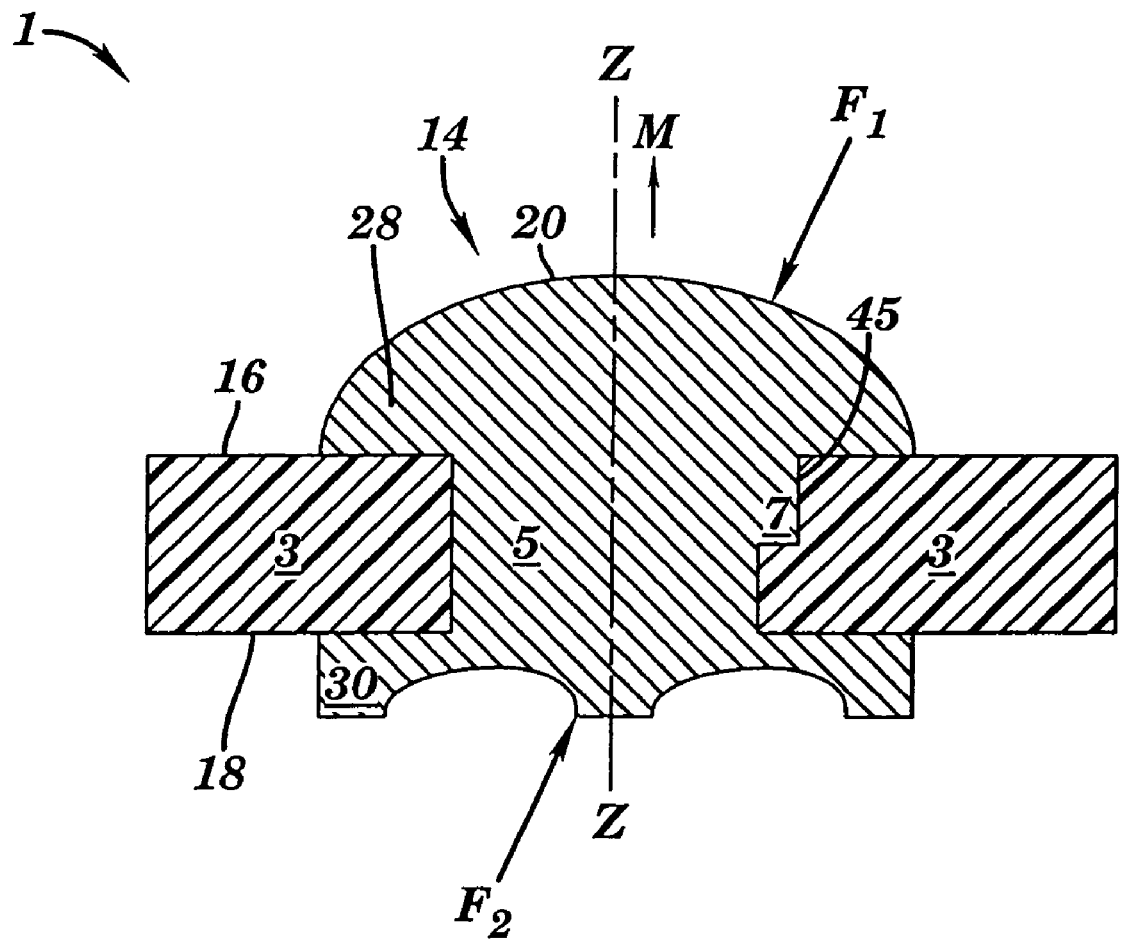
FIG. 5 illustrates FIG. 1 showing a moment about a Z—Z axis that passes through the electrically conductive member, in accordance with embodiments of the present invention.

FIG. 5 illustrates FIG. 1 showing a cross sectional view of the electrical interconnection structure 1 and showing how applied forces $F_1$ and $F_2$ may create a moment M about a Z—Z axis, in accordance with embodiments of the present invention. The forces $F_1$ and $F_2$ may or may not be parallel to each other. $F_1$ may be generated by from a tester 49 and $F_2$ may be generated from an electrical component 51 such as a semiconductor chip (see FIG. 7). Additionally, $F_1$ and/or F2 may be generated from other sources such as cleaning and/or handling processes. If the blind via 7 is not present the electrically conductive member 14 may be free to rotate about the Z—Z axis within the through via 5. For example, if forces $F_1$ and $F_2$ are applied to the electrically conductive member 14, and if forces $F_1$ and $F_2$ have components in a plane that is perpendicular to the Z—Z axis, wherein said force components are displaced from the Z—Z axis, may create a moment M about the Z—Z axis. If this moment M is greater than a resistant moment created by friction between the total contact area of the electrically conductive member 14 and the total contact area of the flexible dielectric layer 3, the electrically conductive member 14 may be free to rotate about the Z—Z axis within the through via 5. The total contact area of the flexible dielectric layer 3 includes contact area under the bump 28, surface area of the through via 5, and contact area under the pad 30. If a plurality of electrically conductive members are used and the electrically conductive members are closely spaced, any rotation of the electrically conductive members may result in electrical shorting of adjacent electrically conductive members, thereby causing a short in an electrical component being tested. For example, the shape of the pads (e.g., pad 30 and adjacent pads may have a square shape) may be such that rotation of the electrically conductive members cause adjacent pads to move close to each other and touch each other. The embodiments, discussed supra in conjunction with FIGS. 1–4, of the present invention prevent such rotation of the electrically conductive member 14. Said rotation is prevented by the addition of the blind via 7 in FIGS. 1–3 which effectively creates a notch that stops rotation. Alternatively, said rotation is prevented by creating a non-circular through via 36 and eliminating the blind via 7 as shown in FIG. 4, said non-circular through via 36 likewise stops rotation.

Figure 6A:
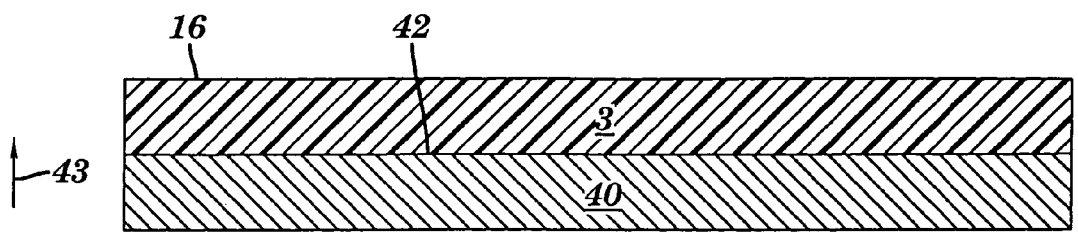
FIG. 6A–6D illustrate a front cross sectional view of method steps used to create the electrical interconnection structure of FIG. 1, in accordance with embodiments of the present invention.
Figure 6B:
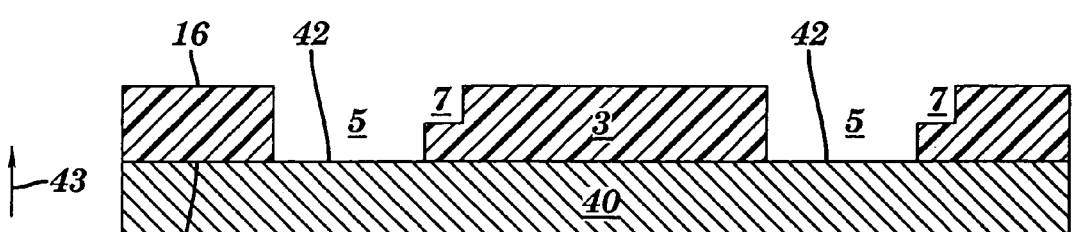
Figure 6C:
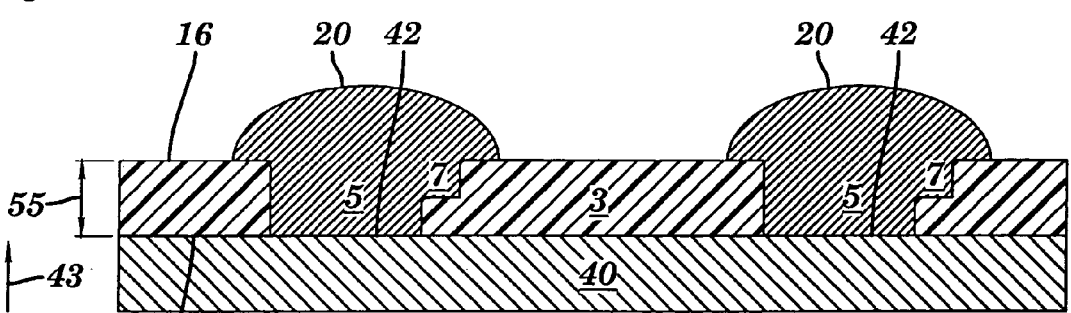
Figure 6D:
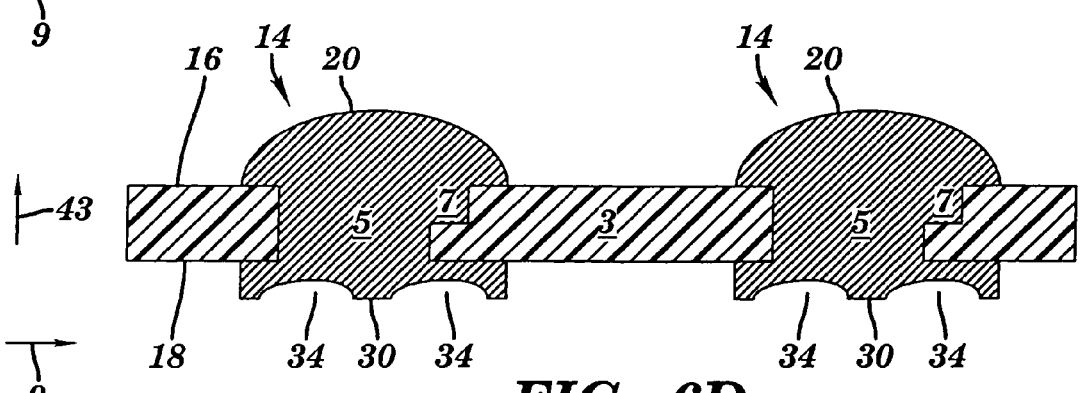

FIG. 6A–6D illustrate a cross sectional view of method steps used to create the electrical interconnection structure 1 of FIG. 1, in accordance with embodiments of the present invention. In FIG. 6A, a metallic layer 40 (e.g., copper, nickel, aluminum, etc.) is bonded to a flexible dielectric layer 3. The metallic layer 40 may be applied by different methods including, inter alia, sputtering. The metallic layer 40 may be applied in a thickness range of about 2000–5000 angstroms. After the metallic layer 40 is deposited on the flexible dielectric layer 3 an electroplating process may be used to bring the metallic layer 40 to a full thickness (i.e., about 1 mil). In FIG. 6A, the through via 5 is created extending from the first side 16 through the second side 18 of the dielectric layer, but not into the metallic layer 40. The through via 5 is created by a drilling process that may include, inter alia, laser drilling. Any laser know to a person of ordinary skill in the art may be used including, inter alia, an Nd:YAG laser, etc. After the through via 5 is created, the blind via 7 is created. The blind via 7 is placed in an offset position from the through via 5, extending laterally in a first direction 9 from the through via 5 and extending vertically in a third direction 43 from the first side 16 of the flexible dielectric layer 3 to a section of the flexible dielectric layer 3 that is between the first side 16 and the second side 18 of the dielectric layer 3. The blind via 7 may be created by the same process as the through via 5. The through via 5 and the blind via 7 may be created in a plurality of polygonal cross-sectional shapes including, inter alia, circular, elliptical, square, rectangular, star shaped, triangular, hexagonal, etc. If laser drilling is used, a focus on the laser may be changed to create different sized vias. An aperture may be placed in the laser beam path to create different shapes of the vias 5 and 7. In FIG. 6C, a curved bump 14 is formed by electroplating a metallic material (e.g., copper) on a first side 42 of the metallic layer 40 and within the through via 5, filling the through via 5, the blind via 7, and extending in a direction 43, thereby causing any distance between the first surface 20 of electrically conductive member 14 and the first side 42 of the metallic layer to be greater than a distance 55 between the first side 16 and the second side 18 of the dielectric layer. The electroplated metallic material extends laterally in the first direction 9 and extends laterally in a direction that is opposite to the first direction 9, thereby causing the plated metallic material to plate outward over the first side 16 of the dielectric layer 3. The surface 20 may be over plated with nickel and then gold over the nickel. Nickel forms a diffusion barrier between the copper and gold. The gold will not oxidize so that it creates very little contact resistance between the surface 20 and a tester. FIG. 6D completes the process of forming the electrical interconnection structure 1 of FIG. 1. The final step is to create the pad 30. The pad 30 (e.g., sculpted pad) may be created by photolithographic and greyscale etching process. The metallic layer 40 is etched away to create a pad 30, thereby creating the electrically conductive member 14. The pad 30 may comprise at least one recessed curved opening 34. This process may be repeated to form a plurality of electrically conductive members that are electrically insulated and mechanically separated each other.

Figure 7:
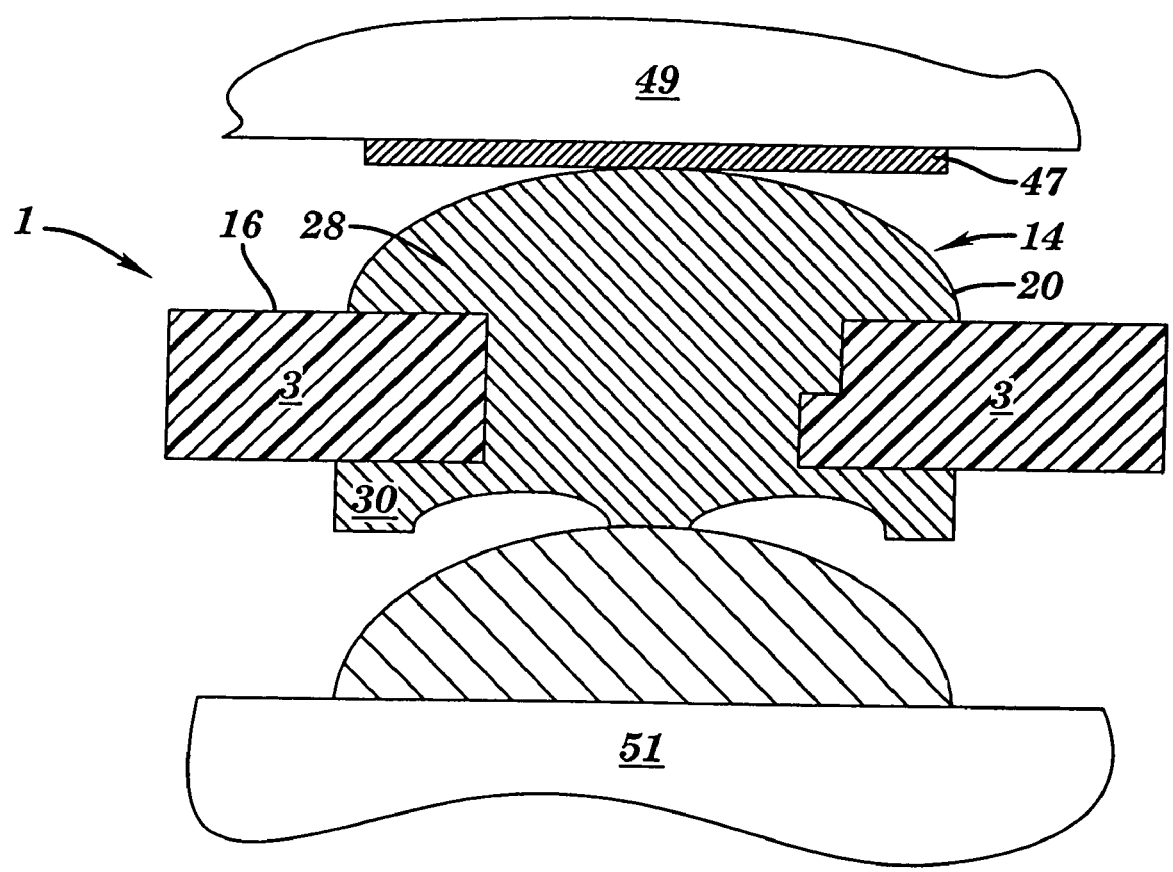
FIG. 7 illustrates FIG. 1 with the electrically conductive member electrically coupling a test apparatus to an electrical component, in accordance with embodiments of the present invention.

FIG. 7 illustrates FIG. 1 showing a cross sectional view of the electrical interconnection structure 1 with the electrically conductive member 14 electrically coupling a test apparatus 49 to an electrical component 51, in accordance with embodiments of the present invention. The electrically conductive member 14 is used to establish an electrical connection between a pad 47 on the test apparatus 49 and the electrical component 51. The pad 47 on the test apparatus 49 may comprise, inter alia, a space transformer, etc. The electrical component 51 may comprise, inter alia, a semiconductor chip (e.g., flip chip applications), etc. A first surface 20 of the electrically conductive member 14 is electrically coupled to the pad 47 on the test apparatus 49 and a pad 30 of the electrically conductive member 14 is electrically coupled to the electrical component 51, thereby establishing the electrical connection between a pad 47 on the test apparatus 49 and an electrical component 51.

While there have been shown and described what are at present considered the preferred embodiments of this invention, it will be obvious to those skilled in the art that various changes and modifications can be made therein without departing from the scope of the invention as defined by the appended claims.

What is claimed is:

1. A method for forming an electrical interconnection structure, comprising:
   providing a flexible dielectric layer having a first side and a second side;
   coupling a first side of a metallic layer to the second side of the flexible dielectric layer;
   creating a first through via extending through the first side to the second side of the dielectric layer;
   creating a first blind via offset from the first through via and extending laterally from the first through via in a first direction and extending in a second direction from the first side of the flexible dielectric layer to a section of the flexible dielectric layer that is between the first side and the second side of the dielectric layer;
   forming a first bump of a metallic material on to the first side of the metallic layer and within the first through via, wherein the metallic material is formed in a third direction, filling the first through via, the first blind via, and extending in the third direction so that any distance between a first surface of the first bump and the first side of the metallic layer is greater than a distance between the first side and the second side of the dielectric layer, and wherein the metallic material extends laterally in the first direction and extends laterally in a direction that is opposite to the first direction; and
   etching a first pad at the end of the metallic layer, wherein the pad is electrically coupled to the bump, and wherein a first electrically conductive member is formed from the first bump, the filled first through via, the filled first blind via, and the etched first pad.

2. The method of claim 1, further comprising:
   creating a second through via extending through the first side to the second side of the dielectric layer;
   creating a second blind via offset from the second through via and extending laterally from the second through via in the first direction and extending in the second direction from the first side of the flexible dielectric layer to a section of the flexible dielectric layer that is between the first side and the second side of the dielectric layer;
   forming a second bump of a metallic material on to the first side of the metallic layer and within the second through via, wherein the metallic material is formed in the third direction, filling the second through via, the second blind via, and extending in the third direction so that any distance between a first surface of the second bump and the first side of the metallic layer is greater than the distance between the first side and the second side of the dielectric layer, and wherein the metallic material extends laterally in the first direction and extends laterally in a direction that is opposite to the first direction; and etching a second pad at the end of the metallic layer, wherein the second pad is electrically coupled to the second bump, wherein a second electrically conductive member is formed from the second bump, the filled second through via, the filled second blind via, and the etched second pad, and wherein the second electrically conductive member is electrically insulated and mechanically separated from the first electrically conductive member.

3. The method of claim 1, wherein a first distance (D) is a maximum distance across a planer region defined by an intersection of the first surface of the first electrically conductive member and the first side of the dielectric layer, wherein a second distance (B) is a distance between an axis and an edge of the blind via that is furthest from the axis, wherein the axis is perpendicular to the first side of the dielectric layer, wherein the axis is centrally located in the through via, and wherein B<D/2.

4. The method of claim 1, wherein the first through via has a circular cross-sectional shape.

5. The method of claim 1, wherein the first blind via has a circular cross-sectional shape.

6. The method of claim 1, wherein the first blind via has a rectangular cross-sectional shape.

7. The method of claim 1, further comprising electrically connecting the first pad to a test apparatus; and electrically connecting the first bump to an electrical component.

8. The method of claim 7, wherein the test apparatus comprises a space transformer and the electrical component comprises a semiconductor chip.

9. The method of claim 1, further comprising forming within a first surface of the pad, at least one recessed curved opening.

10. The method of claim 9, wherein said at least one recessed curved opening is concave.

11. The method of claim 1, wherein a first surface of the first bump comprises a curved surface.

12. The method of claim 1, wherein metallic layer comprises a thickness in a range of about 2000 angstroms to about 5000 angstroms.

13. A method for forming an electrical interconnection structure, comprising:
providing a flexible dielectric layer having a first side and a second side;
coupling a first side of a metallic layer to the second side of the flexible dielectric layer;
creating a non-circular through via extending through the first side to the second side of the flexible dielectric layer, wherein the non-circular through via comprises an elliptical cross-sectional shape; and
forming a first bump of a metallic material on to the first side of the metallic layer and within the non-circular through via, wherein the metallic material is formed in a first direction filling the non-circular through via, and extending in the first direction so that any distance between a first surface of the first bump and the first side of the metallic layer is greater than a distance between the first side and the second side of the flexible dielectric layer, and wherein the metallic material extends laterally in a second direction over a portion of said first side of the flexible dielectric layer and a third direction that is opposite to the second direction; and
etching a first pad at the end of the metallic layer, wherein the pad is electrically coupled to the bump, and wherein a first electrically conductive member is formed from the first bump, the filled first through via, and the etched first pad.

14. The method of claim 13, further comprising electrically connecting the first pad to a test apparatus; and electrically connecting the first bump to an electrical component.

15. The method of claim 13, further comprising forming within a first surface of the pad, at least one recessed curved opening.

16. The method of claim 15, wherein said at least one recessed curved opening is concave.

17. The method of claim 13, wherein a first surface of the first bump comprises a curved surface.

* * * * *